United States Patent [19]

Tanaka

[11] Patent Number: 5,279,705

[45] Date of Patent: * Jan. 18, 1994

[54] GASEOUS PROCESS FOR SELECTIVELY REMOVING SILICON NITRIDE FILM

[75] Inventor: Masato Tanaka, Shiga, Japan

[73] Assignee: Dainippon Screen Mfg. Co., Ltd., Japan

[*] Notice: The portion of the term of this patent subsequent to Dec. 22, 2009 has been disclaimed.

[21] Appl. No.: 796,308

[22] Filed: Nov. 22, 1991

[30] Foreign Application Priority Data

Nov. 28, 1990 [JP] Japan .................................. 2-331986

[51] Int. Cl.[5] .......................................... H01L 21/00
[52] U.S. Cl. ................................ 156/653; 156/662; 156/643; 156/646; 156/657
[58] Field of Search ............... 156/646, 662, 657, 653, 156/655, 651, 652, 656

[56] References Cited

U.S. PATENT DOCUMENTS 4,065,479  8/1986  Faith, Jr. .
4,793,897  12/1988  Dunfield et al. .................... 156/643

FOREIGN PATENT DOCUMENTS 0396002  11/1990  European Pat. Off. .
55-125632  9/1980  Japan .
61-168925  7/1986  Japan .
2-96334  4/1990  Japan .
9004045  4/1990  PCT Int'l Appl. .

OTHER PUBLICATIONS

"The Dry O$_x$ Process for Etching Silicon Dioxide"; Bersin et al.; Solid State Technology, 20(4); 78–80.
"8th Symposium on ULSI Ultraclean Technology-Submicron ULSI Process Technology"; Japan, pp. 200–201.
"Submicron ULSI Process Technology: Proceeding of Symposium on ULSI Ultraclean Technology", Japan, pp. 172–181.
"Etching of Thin SiO$_2$ Layers using Wet HF Gas", P. A. M. Van Der Heide et al., Journal of Vacuum Science and Tech.; Part A, May 1989, pp. 1719–1723.
European Search Report dated Feb. 24, 1992.
N. Miki, H. Kikuyama, I. Kawanabe, M. Miyashita, T. Ohmi, "Gas-Phase Selective Etching of Native Oxide", *IEEE Transactions on Electron Devices*, vol. 37, Jan. 1990.

Primary Examiner—Tom Thomas
Assistant Examiner—George Goudreau
Attorney, Agent, or Firm—Ostrolenk, Faber, Gerb & Soffen

[57] ABSTRACT

A process for selectively removing a silicon nitride film from a silicon layer surface having both a silicon oxide film thereon, and a silicon nitride film, includes the steps of: preparing a gas including at least hydrogen fluoride vapor, and supplying the gas to the silicon layer surface while maintaining the temperature of the silicon layer surface within a predetermined range that is higher than that of the gas. The gas includes a predetermined oxidizing agent, for example, HNO$_3$, O$_3$, H$_2$O$_2$, HClO, HClO$_3$, HNO$_2$, O$_2$, H$_2$SO$_4$, Cl$_2$ or Br$_2$. The temperature of the silicon layer surface is maintained at 10° C. to 90° C., preferably 15° C. to 60° C., more preferably 20° C. to 45° C. higher than the temperature of the gas.

16 Claims, 10 Drawing Sheets

GASEOUS PROCESS FOR SELECTIVELY REMOVING SILICON NITRIDE FILM

BACKGROUND OF THE INVENTION

1. Field of the Invention

The present invention relates generally to a process for selectively removing an insulation film formed on the surface of a silicon wafer, a polycrystalline silicon film, and amorphous silicon (simply referred to as "silicon layer surface" hereinafter), and more particularly, to a process for selectively removing a silicon nitride film (SiNx) from a silicon layer surface on which a silicon oxide film is also present. The process of the present invention has applicability to the process of manufacturing a semiconductor device in general, and, for example, is applicable to the removal of a SiNx film at the final step of the LOCOS Process (Localized Oxidization of Silicon) in manufacturing a dynamic memory.

2. Description of the Related Art

A silicon nitride film is formed on a silicon wafer in the LOCOS process when making a dynamic memory. The LOCOS process is utilized in the manufacture of a dynamic memory for forming a boron diffusion layer used as a channel stopper and a thick silicon oxide film in an element isolation region by selective oxidation using a silicon nitride film.

In the first step of the LOCOS process, a thin silicon oxide film is formed on the surface of a silicon wafer. A silicon nitride film is grown on the surface of the thin silicon oxide film by the thermal decomposition reaction of ammonia ($NH_3$) and monosilane ($SiH_4$). A patterned photoresist film is formed on the nitride film by lithography so as to cover only the region where the nitride film is to remain. The nitride film is etched by a plasma etching apparatus using carbon tetrafluoride ($CF_4$) gas. Then, boron is ion-implanted to form the channel stopper in an element isolation region using the resist film and the nitride film as a mask.

After removing the resist film from the nitride film, a thermal silicon oxide film is selectively formed (LOCOS oxidation) using the nitride film as a mask. A thin oxide film is formed on the nitride film during LOCOS. This thin oxide film is removed by wet etching. The silicon nitride film is then selectively removed from the silicon wafer. This completes the LOCOS process.

The selective removal of silicon nitride film in the last step of the LOCOS process conventionally employs the wet etching method disclosed in Japanese Patent Laying-Open No. 2-96334 and Japanese Patent Laying-Open No. 61-168925, for example.

In the conventional method, a phosphoric acid aqueous solution of high concentration (approximately 85%) is used as the etchant. The phosphoric acid aqueous solution is stored in an etching bath and heated to a high temperature (140°-180° C.) A silicon wafer is immersed in the phosphoric acid aqueous solution at that high temperature. Thus, the removal of a SiNx film from a silicon wafer has been carried out by a batch in the conventional wet etching method, as described above.

However, the process according to the conventional wet etching method includes the following problems:

(1) Phosphoric acid aqueous solution of high concentration is heated to a high temperature near the boiling point for use as an etchant in the conventional method. Handling a phosphoric acid aqueous solution at a high temperature is very dangerous.

(2) Implementation of the method requires a circulation filtration system and the like, which complicates the structure of the apparatus.

(3) Because the phosphoric acid aqueous solution is of high concentration and high temperature, equipment such as pumps and filters or pipes will be degraded in a relatively short time period, even though materials superior in corrosion-resistance and durability such as fluororesin and polypropylene are used.

(4) Water evaporates from the phosphoric acid aqueous solution since its temperature is maintained in the vicinity of the boiling point during the etching process. This increases its concentration as time elapses. In order to maintain the concentration at a constant level, pure water corresponding to the amount of evaporated water must be supplied. However, pure water added in drops into phosphoric acid aqueous solution of high concentration causes water to boil locally. This necessitates various measures in the method of supplying pure water in order to avoid this danger. The structure of the apparatus will become complicated, and the manufacture thereof is not easy. It is also hard to control the amount of water to be supplied, and the controllability of the etching process is not satisfactory. Moreover, usage of the wet etching method increases the amount of consumed etchant.

SUMMARY OF THE INVENTION

An object of the present invention is to allow selective removal of a silicon nitride film from a silicon layer surface without using a phosphoric acid aqueous solution a high temperature.

Another object of the present invention is to provide a gaseous process for selectively removing a silicon nitride film from a silicon layer surface on which a silicon oxide film is present.

A further object of the present invention is to specify the conditions of selectively removing a silicon nitride film by a gaseous process.

A still further object of the present invention is to establish conditions for sufficiently enhancing the ability to select a silicon nitride film in preference to a silicon oxide film in removing a silicon nitride film by a gaseous process.

An additional object of the present invention is to specify the components of a process gas required to sufficiently increase the selectivity in order to selectively remove a silicon nitride film by a gaseous process using hydrogen fluoride.

Yet another additional object of the present invention is to specify conditions of the temperatures of the process gas and a silicon layer surface for selectively removing a silicon nitride film from the silicon layer surface by a gaseous process.

A process according to the present invention includes the steps of: preparing a gas including at least hydrogen fluoride vapor and a predetermined oxidizing agent in a gas phase; and providing the gas to the silicon layer surface while maintaining the temperature of the silicon layer surface within a predetermined range which is higher than the temperature of the gas.

It has been confirmed by experiments that the selectivity of the removal of the silicon nitride film at the silicon layer surface as opposed to the silicon oxide film was increased when the gas was supplied to the silicon layer surface while maintaining the temperature of the silicon layer surface within a predetermined range that is higher than the temperature of the gas. It is therefore possible to selectively remove a silicon nitride film by processing the silicon layer surface while maintaining the temperature of the silicon layer surface within the above-described range. The apparatus for carrying out such a method has a relatively simple structure and is safe to handle, since it does not use an etchant comprising a phosphoric acid aqueous solution.

Preferably, the oxidizing agent is selected from the group consisting of nitric acid, ozone, hydrogen peroxide, hypochlorous acid, chloric acid, oxygen, sulfuric acid, chlorine, and bromine.

It has been discovered through experiments that, by adding the above described oxidizing agent to the gas, the etching rate of silicon nitride film becomes higher than in the case where no such agent, is added to the gas, thereby also enhancing the ability to select of silicon nitride films as against silicon oxide films. It is therefore possible to selectively remove a silicon nitride film more efficiently by including an oxidizing agent in the gas.

More preferably, the process of supplying gas to the silicon layer surface includes the step of directing ultraviolet light to the silicon layer surface.

According to a preferred embodiment of the present invention, the step of preparing the gas includes the steps of mixing hydrofluoric acid of a predetermined concentration and nitric acid of a predetermined concentration at a predetermined volume percentage; and producing the gas by vaporizing the mixed hydrofluoric acid and nitric acid. Furthermore, the silicon oxide film includes a thermal silicon oxide film. The temperature of the silicon layer surface is,, selected to be within a range that is from approximately 10° C. to approximately 90° C. higher than the temperature of the gas.

It has been discovered by experiments that the etching rate of the silicon nitride film becomes higher than that of the thermal silicon oxide film when the temperature of the silicon layer surface is within the above-described range. It is therefore possible to remove the silicon nitride film more rapidly than the silicon thermal oxide film by supplying the gas to the silicon layer surface while maintaining the temperature of the silicon layer surface within the above-described range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
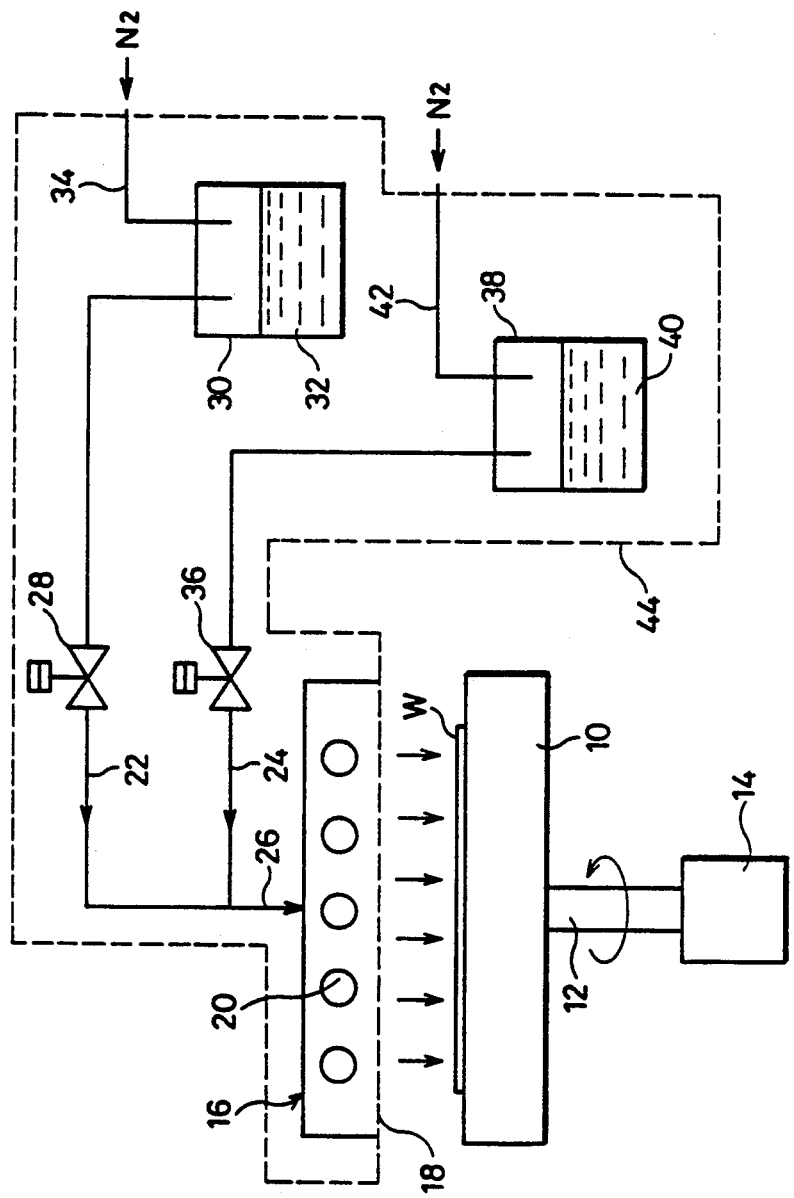
FIG. 1 schematically shows the structure of an apparatus used in the process according to the present invention.

FIG. 1 schematically shows the apparatus for carrying out the process according to an embodiment of the present invention. Referring to FIG. 1, the apparatus includes a hot plate 10 for holding by suction a silicon wafer W to be etched on the top plate thereof Hot plate 10 includes a heater (not shown) therein. The central portion of the bottom of hot plate 10 is fixed to a shaft 12. An electric motor 14 is connected to the lower end of shaft 12. Shaft 12 and hot plate 10 rotate around the vertical shaft axis by the rotation of the rotary axis of electric motor 14. The heater provided in hot plate 10 is controlled by a temperature control means not shown to maintain the surface temperature of hot plate 10 at a predetermined temperature, which in turn maintains the temperature of silicon wafer W at a predetermined temperature.

This apparatus further includes a gas supplying unit 44 for supplying etching gas to the surface of substrate W held on the top plate of hot plate 10.

Gas supplying unit 44 includes a vapor supplying unit 16 serving as the mixed gas supplying means, provided above hot plate 10 to face silicon wafer W held on hot plate 10. Vapor supplying unit 16 includes a diffusion plate 18 having a plurality of openings, provided in parallel to the top face of hot plate 10, and an ultraviolet light irradiation lamp 20, each provided to be in parallel with silicon wafer W for directing ultraviolet light to the surface of silicon wafer W. The surface of ultraviolet light irradiation lamp 20 is formed of sapphire glass for preventing corrosion since hydrofluoric acid vapor is used as the etchant in the present embodiment. The provision of an ultraviolet light irradiation lamp 20 increases the selectivity of the silicon nitride film to the silicon oxide film. It is to be noted that the ultraviolet light irradiation lamp is dispensable.

The apparatus further includes a hydrofluoric acid tank 30 for storing hydrogen fluoride acid 32, which is an aqueous solution of liquid hydrogen fluoride (referred to as hydrofluoric acid hereinafter); a nitric acid tank 38 for storing nitric acid 40 acting as an oxidizing agent; mixed vapor flow line 26 communicating with vapor supplying unit 16; a hydrofluoric acid vapor supplying flow line 22 having one end communicating with hydrofluoric acid tank 30 and the other end communicating with mixed vapor flow line 26; a nitric acid vapor supplying flow line 24 having one end communicating with nitric acid tank 40 and the other end with mixed vapor flow line 26; and supplying flow lines 34 and 42 communicating with hydrofluoric acid tank 30 and nitric acid 38, respectively, for supplying carrier $N_2$ gas to each of tanks 30 and 38. Hydrofluoric acid vapor supplying flow line 22 and nitric acid vapor supplying flow line 24 are provided with valves 28 and 36 for controlling the supply of hydrofluoric acid vapor and nitric acid vapor to vapor supplying unit 16.

An appropriate amount of hydrofluoric acid is supplied from a hydrofluoric acid supply source (not shown) through a supplying flow line (not shown) to hydrofluoric acid tank 30 so that a predetermined amount of hydrofluoric acid 32 is always stored in the tank. Similarly, nitric acid is supplied from a nitric acid supply source (not shown) through a supplying flow line (not shown) to nitric acid tank 38 so that a predetermined amount of nitric acid 40 is always stored in the tank. Gas supplying unit 44 is maintained at a predetermined temperature by a temperature controller and heating means not shown. As a result, the temperature of the mixed vapor including hydrofluoric acid and nitric acid provided from supplying unit 16 to the surface of silicon wafer W is maintained at a predetermined temperature.

Using the apparatus of FIG. 1, the surface of wafer W is etched as will be described below. Etching gas including hydrofluoric acid and nitric acid and having its temperature controlled to a predetermined level is supplied to the surface of wafer W. The temperature of wafer W is adjusted to a predetermined temperature by the heater (not shown) provided in hot plate 10. The temperature of wafer W is maintained within a predetermined range which is higher than the temperature of the supplied mixed vapor. A thermal silicon oxide film and a silicon nitride film are formed on the surface of wafer W. In selectively removing the silicon nitride film, the range of the temperature is maintained at a temperature at least 2° C., preferably at least 10° C., more preferably at least 20° C. higher than the temperature of the supplied mixed vapor. This temperature is within a range that is at most 90° C., preferably at most 60° C., and more preferably at most 45° C. higher than the temperature of the supplied mixed vapor, depending on conditions such as the composition of the supplied mixed vapor.

Silicon wafer W maintained at the above-described temperature is rotated by motor 14 and mixed vapor including hydrofluoric acid and nitric acid is supplied to the surface thereof. The surface of wafer W is etched, whereby the silicon nitride film is selectively removed. Because vapor of nitric acid is included in the mixed vapor, the selectivity of the silicon nitride film to the thermal silicon oxide film is increased in comparison with the case where nitric acid is not included, so that the silicon nitride film is selectively removed in a more satisfactory manner.

When the difference between the temperature of the mixed gas and the temperature of the wafer surface is less than a predetermined value, the etching rate of the silicon oxide film is greater than that of the silicon nitride film. In this case, the silicon nitride film cannot be selectively removed. When the temperature is above a predetermined temperature, it has been confirmed from experiments that the etching rate of the silicon nitride film is greater than that of the silicon oxide film. It is considered that this is caused by the difference of film characteristics of the silicon oxide film and the silicon nitride film.

According to the process of the present embodiment, the etching selectivity of the silicon nitride film to the silicon oxide film increases by the addition of nitric acid in gas. The reasons are considered to be as follows. A silicon oxide film is already an oxide and therefore, it is hardly influenced by the addition of an oxidizing agent such as nitric acid to the mixed gas, and the etching rate thereof only changes depending only on the temperature difference between the gas and the substrate surface. On the contrary, the silicon nitride film is not an oxide, so that the addition of an oxidizing agent will accelerate its oxidation. Thus, the silicon nitride film becomes ready to decompose by hydrogen fluoride.

It is easily understood that not only nitric acid, but also any oxidizing agent such as ozone, hydrogen peroxide, hypochlorous acid, chloric acid, nitrous acid, oxygen, sulfuric acid, chlorine, and bromine used solely or in combination is available as the substance added to the mixed gas.

The addition of ozone to mixed gas is carried out as follows. $O_3$ gas is introduced into a hydrofluoric acid tank in which hydrofluoric acid is stored. Then, hydrofluoric acid vapor mixed with $O_3$ gas is supplied from the hydrofluoric acid tank to the vapor supplying unit.

Alternatively, the usage of hydrogen peroxide is carried out as follows. First, hydrofluoric acid and $H_2O_2$ are mixed and stored within a mixed liquid tank. Nitrogen gas is introduced into this mixed liquid tank. Then, a mixed vapor of HF and $H_2O_2$ is supplied from the mixed liquid tank to the vapor supplying unit.

When the temperature difference exceeds a predetermined value, the values of the etching rates of the thermal silicon oxide film and the silicon nitride film invert again. Although the reason for this inversion is not clear, this tendency was obviously identifiable at least in the experiment. Therefore, it has been found out from the results of the experiments that will be described later that the silicon nitride film can be selectively removed by maintaining the temperature of the wafer within a predetermined range of temperature that is higher than the temperature of the supplied mixed gas. An experiment carried out in association with the process of the present invention will be described hereinafter.

Figure 2:
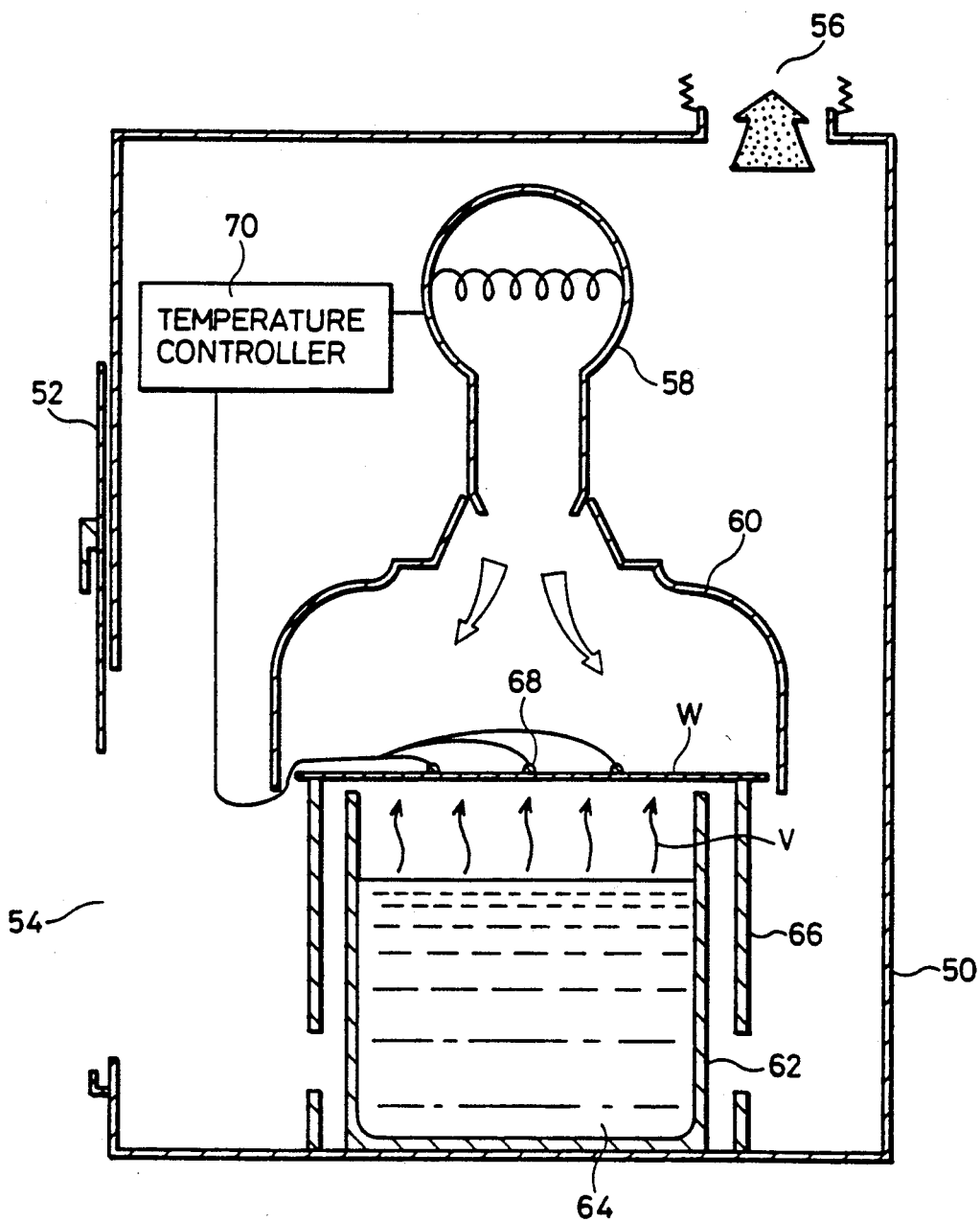
FIG. 2 is a vertical sectional view schematically showing the apparatus used in the experiments carried out related to the process of the present invention.

FIG. 2 shows the schematic structure of an apparatus used in the experiment. Referring to FIG. 2, this apparatus includes a draft chamber 50 having a work opening 54 and an exhaust opening 56 communicating with a force exhaust fan not shown, a shutter 52 provided at the outer face of draft chamber 50 for opening/closing work opening 54, a cylindrical container 62 provided inside draft chamber 50 for containing a mixed liquid 64 which becomes the vapor source, wafer support members 66 at the circumference of cylindrical container 62 for holding at their upper ends the bottom of wafer W so that wafer W is horizontal, a wafer heating cover 60 provided above cylindrical container 62 and wafer support members 66 to cover the surface of wafer W supported by wafer support members 66, an air heater 58 provided inside the upper end of wafer heating cover 60 for heating air inside the cover 60, a CA (chromel-alumel) thermocouple 68 in contact with and attached to the surface of wafer W for monitoring the surface temperature of wafer W, and a temperature controller 70 for controlling air heater 58 according to the output of thermocouple 68 and for controlling the temperature of the hot air supplied to wafer W, thereby maintaining the surface temperature of silicon wafer W at a predetermined value. The inside of draft chamber 50 is maintained at 22° C. Therefore, the temperature of mixed liquid 64 in cylindrical container 62, and the temperature of the mixed vapor V generated from mixed liquid 64 are maintained at 22° C.

In the experiment, silicon wafers of 6 inch in diameter having a thermal silicon oxide film of 5000 Å in thickness formed on the surface thereof, and silicon wafers of 5 inch in diameter having a silicon nitride film of 1500 Å film in thickness formed on the surface thereon are subjected to etching. Each wafer was horizontally placed above cylindrical container 62 so that the thermal silicon oxide film and the silicon nitride film respectively faced downward.

The film thickness of an insulation film subsequent to the etching process was measured using "Lambda Ace" (apparatus manufactured by Dainippon Screen Mfg. Co., Ltd. for measuring film thickness utilizing interference of light by a microspectroscope) in the case where the etching amount was 50 Å or more. Those having an etching amount less than 50 Å were measured by an ellipsometer (apparatus for measuring film thickness according to polarized light analyzing method made by Gardner Co., Ltd.).

Figure 3:
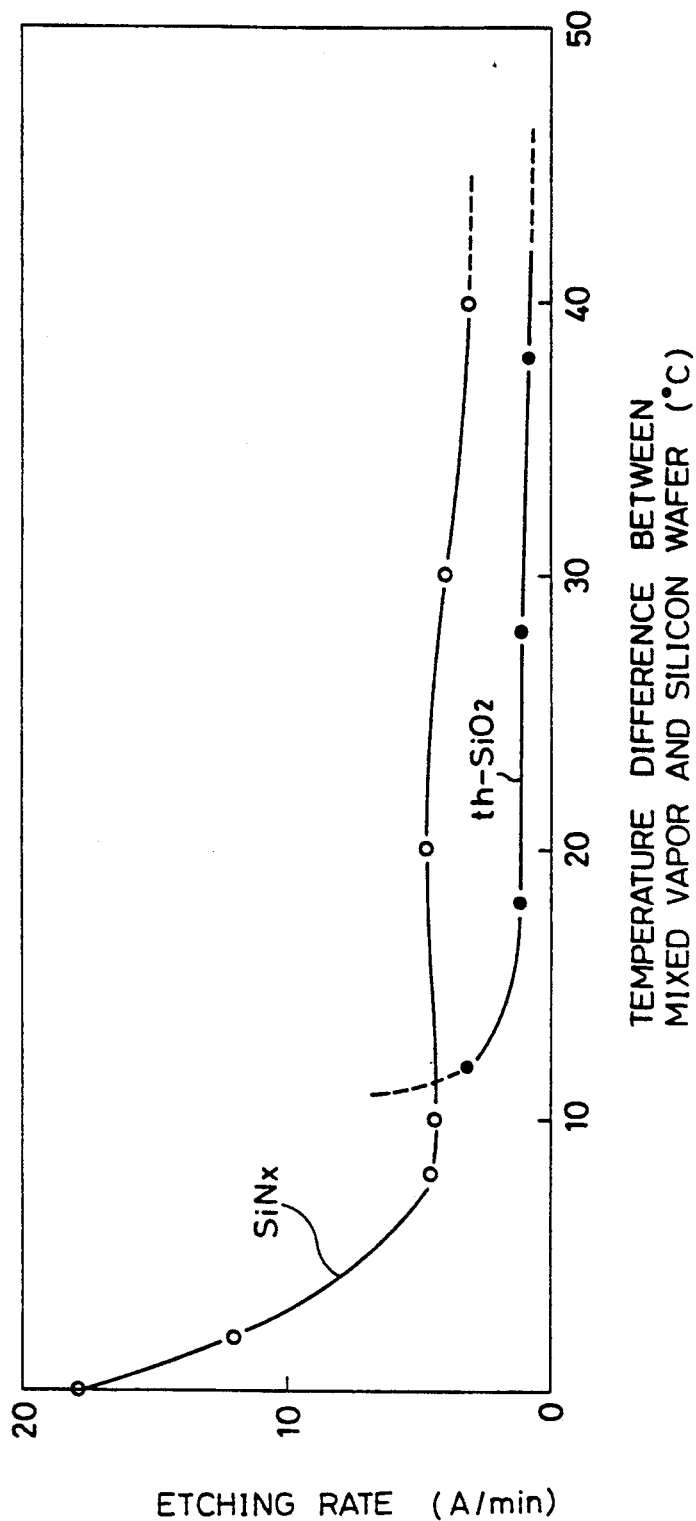
FIG. 3 is a graph showing the etching rates of the silicon nitride film and the thermal silicon oxide film versus the temperature differences of the mixed gas including hydrofluoric acid and the silicon layer surface

The experiment in which the possibility was found out of selectively etching a silicon nitride film with respect to a silicon thermal oxide film will be described hereinafter. FIG. 3 shows the relationship between the etching rates of a silicon nitride film (SiNx) and a thermal silicon oxide film (th-SiO$_2$) etched respectively by hydrofluoric acid vapor not including nitric acid, and the difference of temperature between the temperature of the mixed vapor ($t_1$) and the temperature of the silicon wafer surface ($t_2$) (referred simply to "temperature difference" hereinafter). Note that $t_1 < t_2$ holds. Hydrofluoric acid of azeotropic composition (approximately 40%) was used as the vapor source in this experiment.

Referring to FIG. 3, the etching rate of the silicon nitride film was significantly small in comparison with that of the thermal silicon oxide film when the temperature difference was low. However, the etching rates of the silicon nitride film and the thermal silicon oxide film were inverted where the temperature difference becomes greater than approximately 12° C. That is to say, the etching rate of the silicon nitride film becomes greater than that of the thermal silicon oxide film. Therefore, a possibility was found to selectively remove a silicon nitride film from the wafer surface in which a thermal silicon oxide film exists by providing appropriate means for increasing the etching rate difference of the insulation films.

Figure 4:
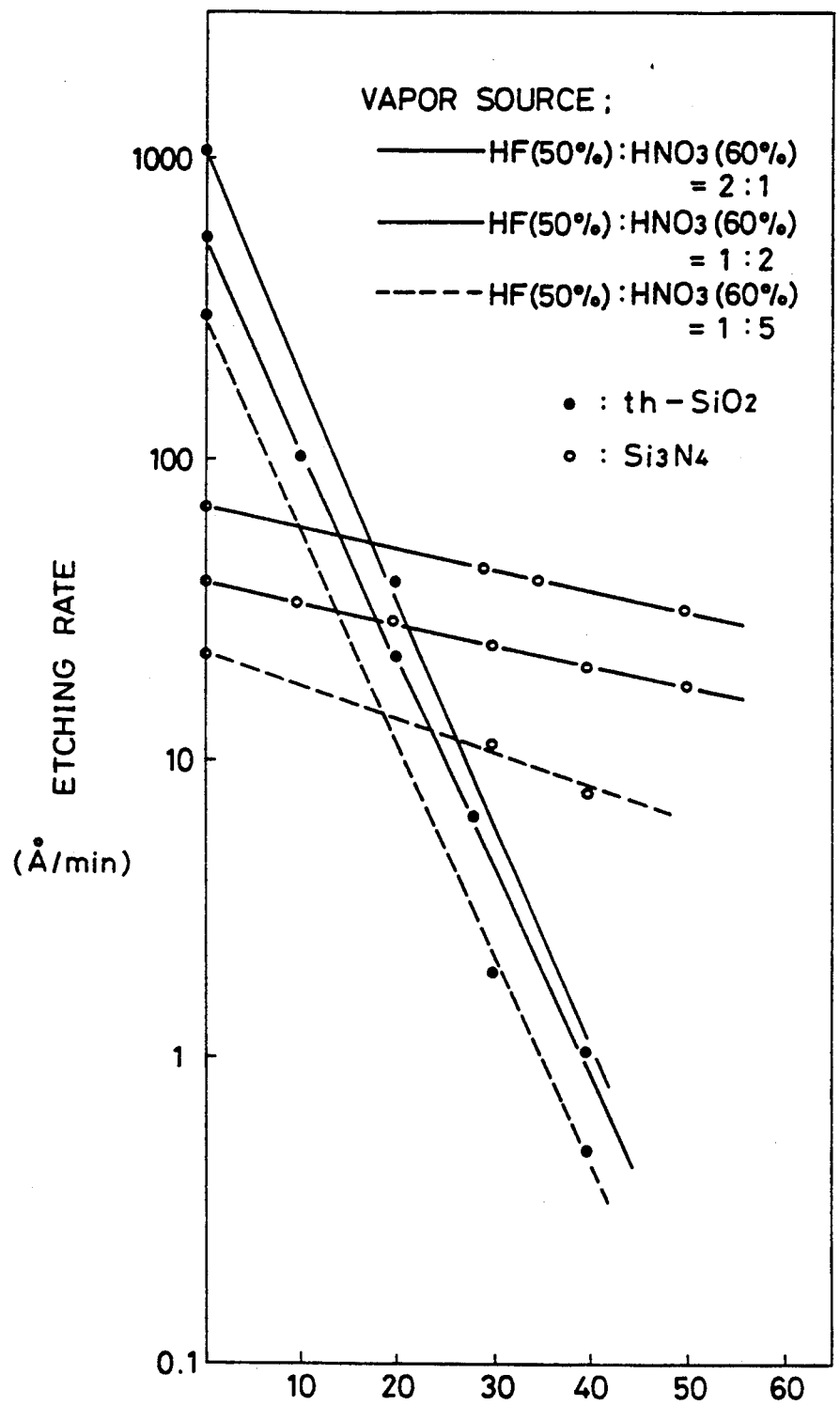
FIGS. 4 and 5 are graphs showing the results of the experiments carried out using the apparatus of FIG. 2.
Figure 5:
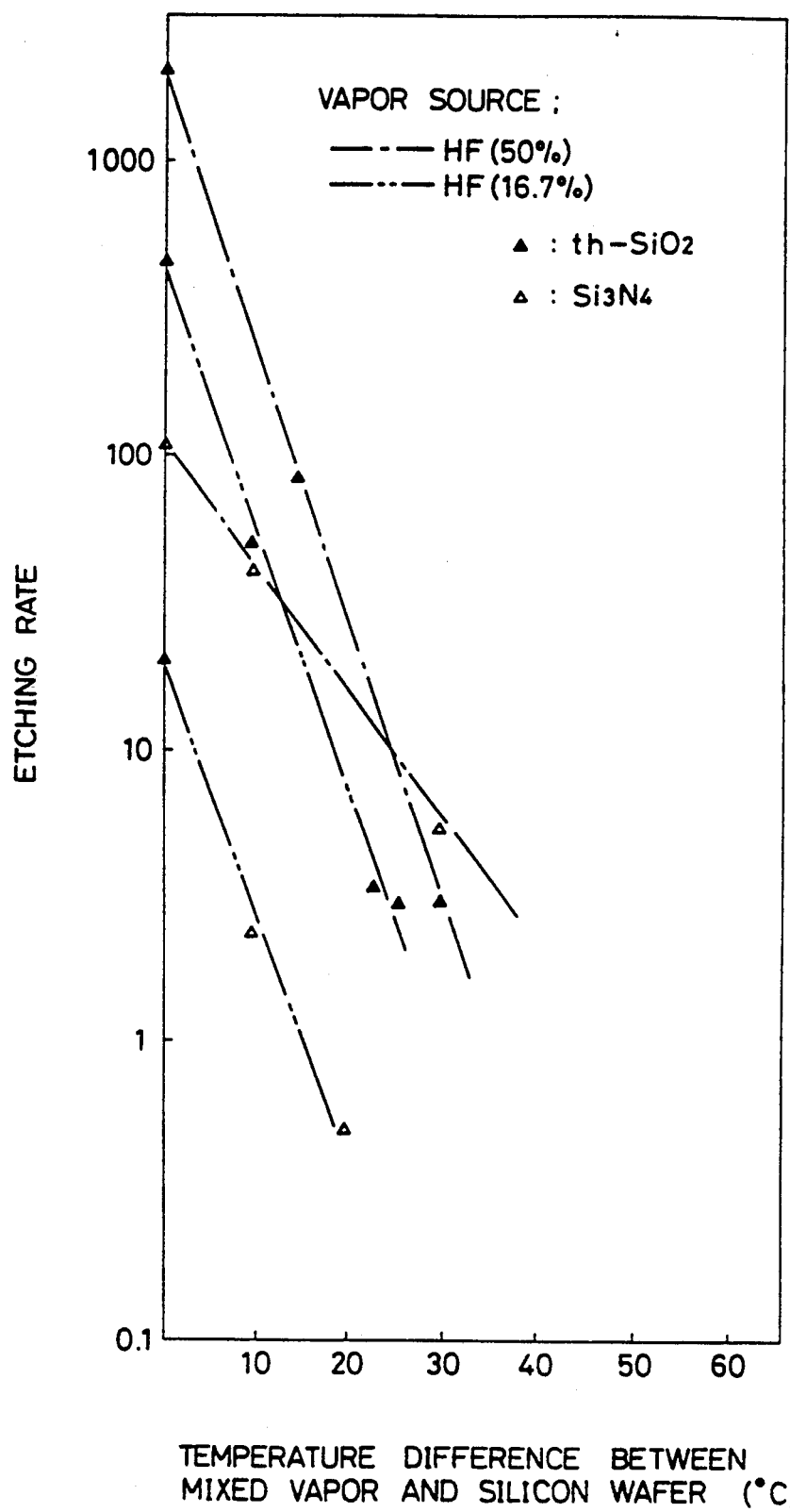

FIGS. 4 and 5 show the relationship between the temperature difference and the etching rates of a silicon nitride film (Si$_3$N$_4$) and a thermal silicon oxide film (th-SiO$_2$), with various vapor sources. It is particularly noted with reference to FIG. 5 that the etching rate of the silicon nitride film decreases drastically in proportion to the increase of temperature difference in the case where nitric acid (oxidizing agent) was not added to hydrofluoric acid. In the case nitric acid was added to hydrofluoric acid, the etching rate of the silicon nitride film did not show such a drastic decrease, as shown in FIG. 4. On the contrary, the etching rate of the thermal silicon oxide film decreases drastically in proportion to the increase of temperature difference regardless of the addition of nitric acid to hydrofluoric acid (refer to FIGS. 4 and 5).

It has become apparent from the above-described results that the selectivity in etching of the silicon nitride film to the thermal silicon oxide film is increased by adding nitric acid to hydrofluoric acid. As far as one can see from FIGS. 4 and 5, the selectivity increases in proportion to the increase of temperature difference. (Actually, the etching rate of the silicon nitride film became smaller than that of the thermal silicon oxide film again when the temperature difference exceeds a certain range, as will be described later).

In the experiments of FIGS. 4 and 5, vapor sources included commercially available hydrofluoric acid 50% (a product of DAIKIN INDUSTRIES, LTD.), a mixture of hydrofluoric acid 16.7% solution of hydrofluoric acid diluted at a ratio of HF (50%):H$_2$O = 1:2, and a mixture of hydrofluoric acid (50%) and sulfuric acid (60%) mixed at a volume percentage of 2:1, 1:2, and 1:5, respectively.

When the temperature difference was 30° C., the selectivity (Si$_3$N$_4$:th-SiO$_2$) was 6.5–7.3. When the temperature difference was 40° C., the selectivity was 20.0–37.0. The selectivity was further increased to 47.5–68.0 when the temperature difference was 45° C. (refer to FIG. 4).

For comparison, results obtained by a conventional wet selective etching method will be shown hereinafter. For example, a 4 inch wafer was used as a sample having an oxide film of 6076 Å in thickness and a nitride film of 1400 Å in thickness formed thereon. The silicon nitride film and the oxide film were etched using phosphoric acid (H$_3$PO$_4$) as an etchant heated to 180° C. Under these conditions, these etching rates were approximately 93 Å/min. and approximately 4 Å/min., respectively. That is to say, the selectivity was approximately 23:1. In the present invention, a selectivity of at least 23.0 is obtained by selecting the temperature difference within an appropriate range. This selectivity is no means inferior to that of a conventional wet selection etching method.

In the case where the vapor source was hydrofluoric acid not including nitric acid, the selectivity at the temperature difference of 30° C. was approximately 2.0. When the temperature difference was 40° C., the selectivity was 5.8. Although the etching rate of the silicon nitride film was greater than that of the thermal silicon oxide film, the selectivity was relatively low in comparison with the case where nitric acid was added to the mixed solution. In the case where only hydrofluoric acid 16.7% solution was the vapor source, there was scarcely any selectivity (refer to FIG. 5).

The inventor carried out the following experiment using the apparatus having the structure of FIG. 1 to confirm the above results more accurately. In the experiment, silicon wafers similar to those used in the experiments of FIGS. 3–5 were used. The following three mixed gas supplying sources were used in the experiment:

(1) Azeotropic composition hydrofluoric acid
(2) A mixture of 50% hydrofluoric acid and 69% nitric acid at a ratio of 1:1 in volume
(3) A mixture of 50% hydrofluoric acid and 69% nitric acid at a ratio of 2:1 in volume.

Nine hundred cc of each vapor were prepared and supplied to the vapor generation tank of the apparatus. The temperature of the mixture was maintained at 40° C. during the experiments. The temperatures of carrier nitrogen gas and nitrogen gas for purging the flow line were also maintained at 40° C. The temperature of the hot plate was varied within the range of 22° C.–150° C. The etching rate was measured using the aforementioned Lambda Ace and the ellipsometer. The measurements were carried out for 17 sample points of the wafer surface in the case of Lambda Ace, and for 21 sample points of the wafer surface in the case of the ellipsometer.

Figure 6:
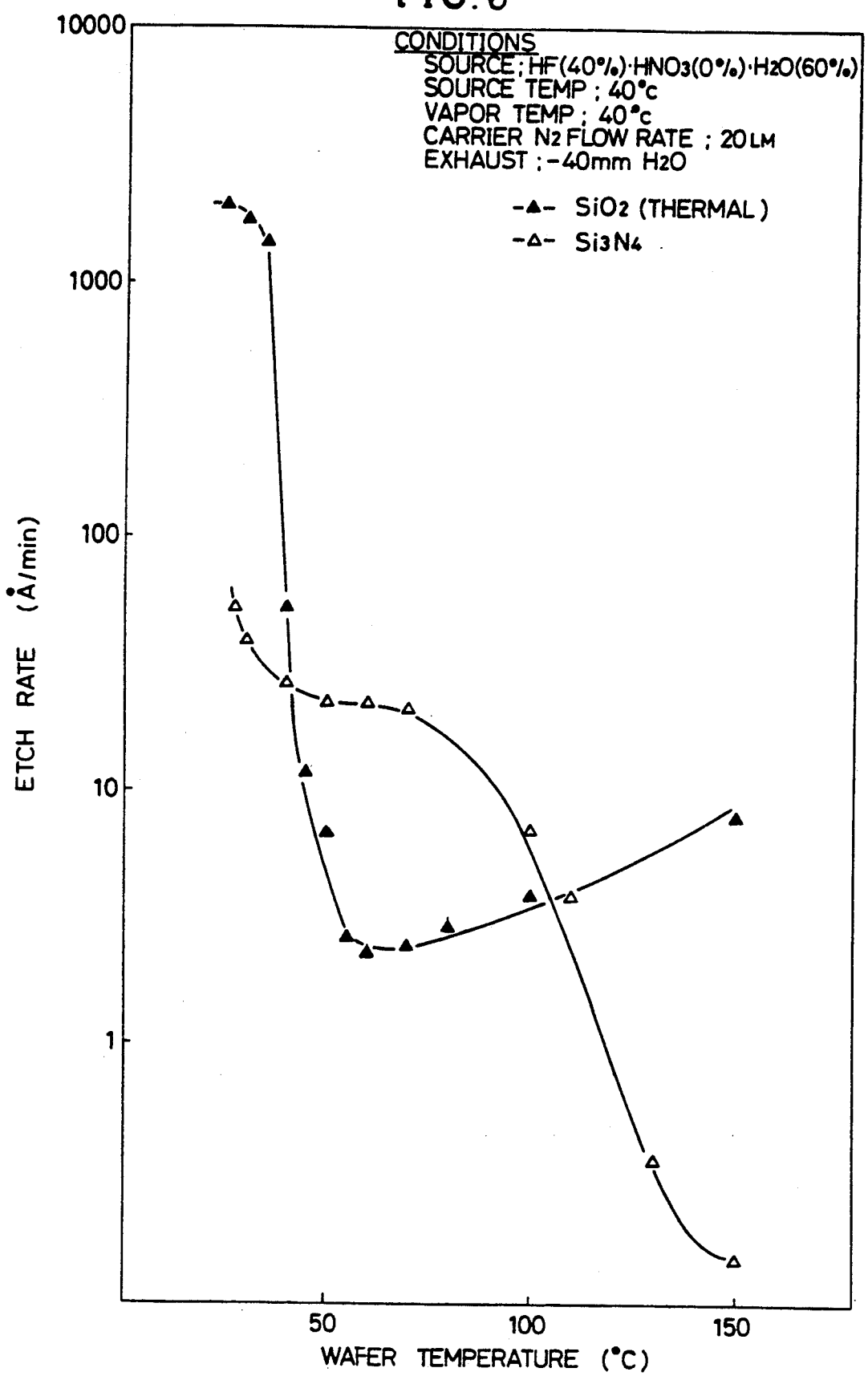
FIGS. 6-8 are graphs showing the results of the experiments carried out for various wafer surface temperatures with different compositions of process gas.
Figure 7:
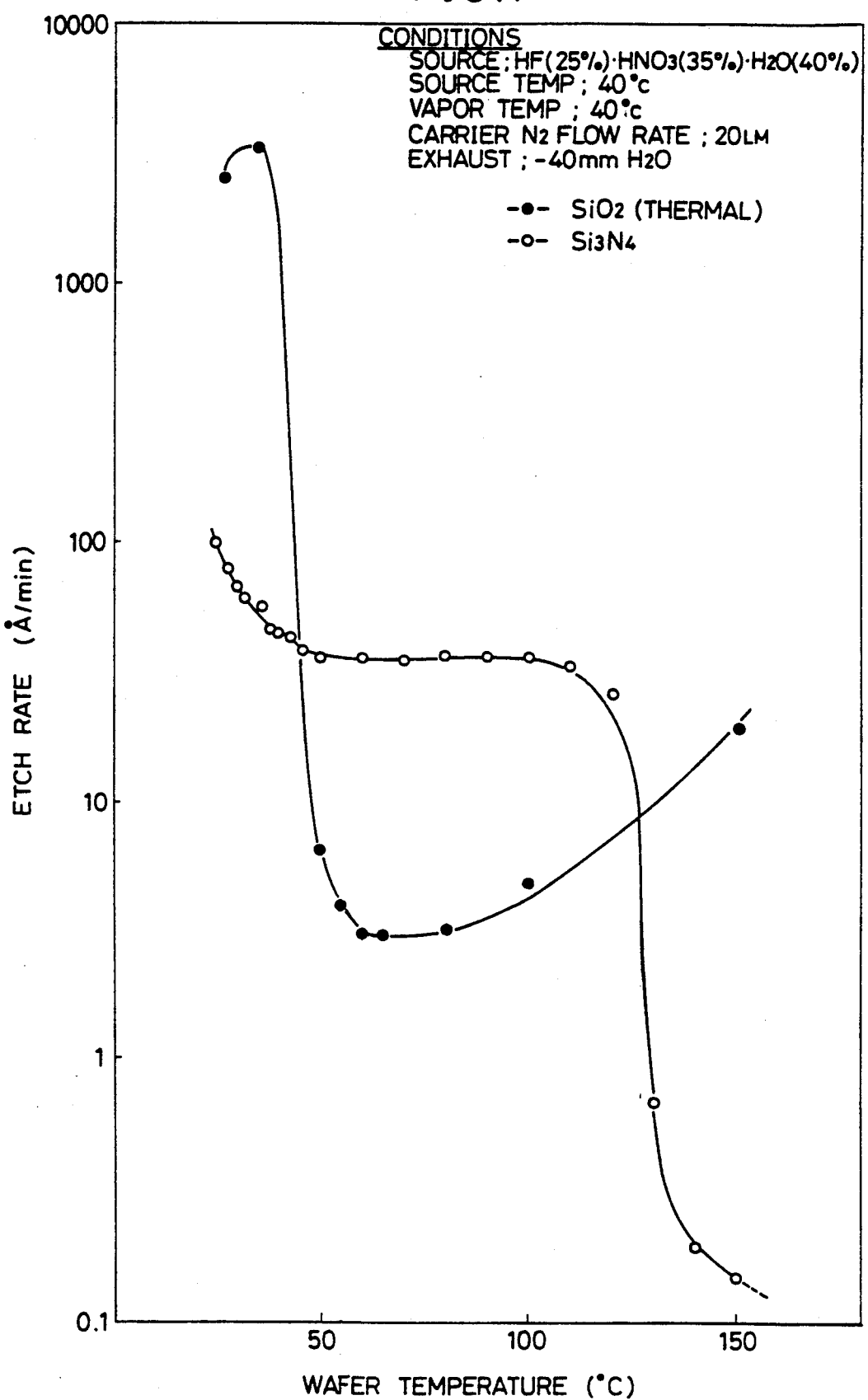
Figure 8:
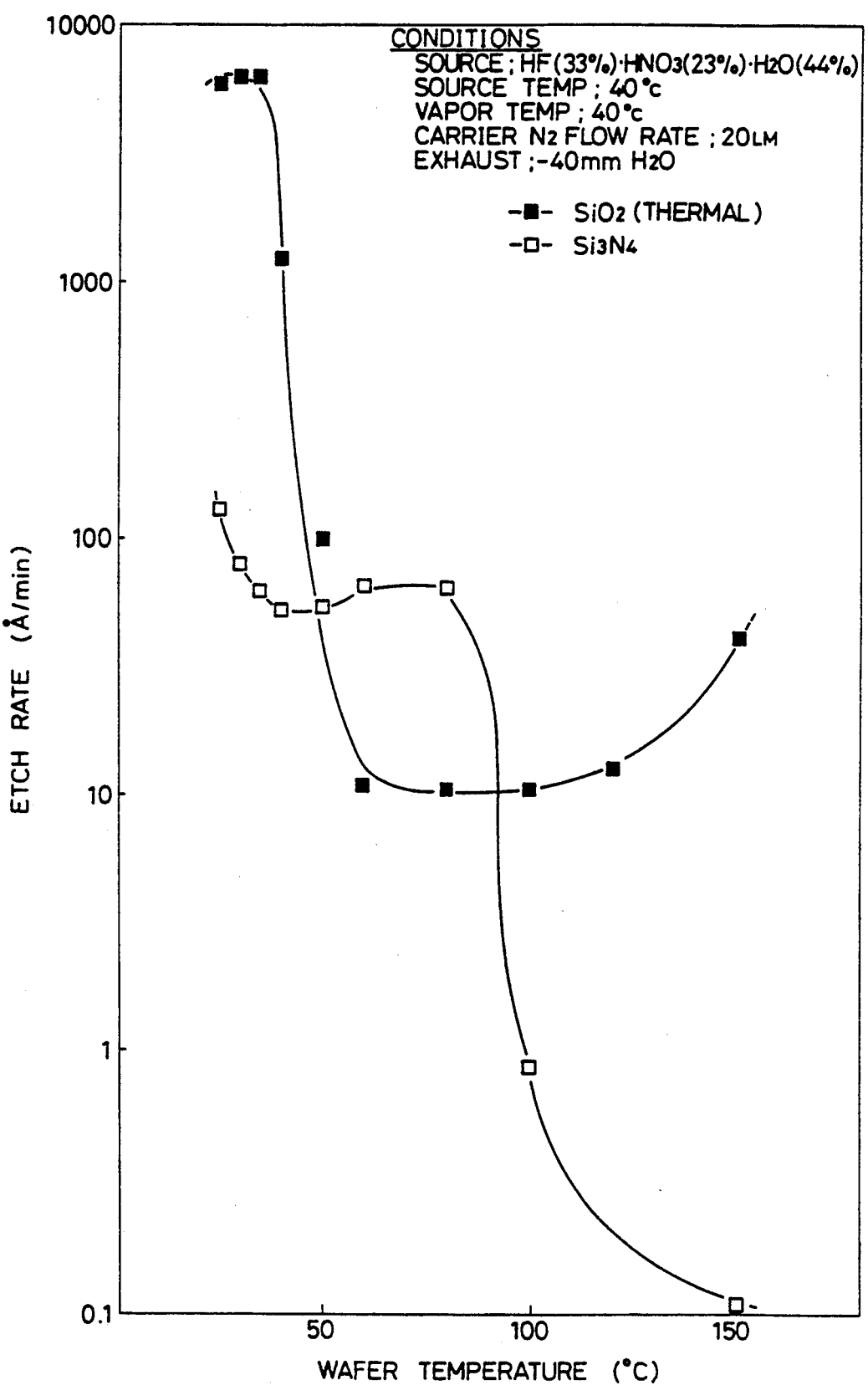

FIGS. 6, 7, and 8 show the relationship between etching rates of the silicon nitride film and the thermal silicon oxide film, and the temperature of the hot plate, when the supplying source is azeotropic composition hydrofluoric acid, a 1:1 mixture of hydrofluoric acid and nitric acid, and a 2:1 mixture of hydrofluoric acid and nitric acid, respectively. The hot plate temperature was considered to be substantially equal to that of the wafer.

It can be seen from FIGS. 6–8 that the etching rate of the $SiO_2$ film was greater than that of the $Si_3N_4$ film when the wafer temperature was less than the gas temperature (40° C.). The etching rate of the $Si_3N_4$ film exceeded that of the $SiO_2$ film in the vicinity of the wafer temperature of 40° C. where temperature difference did not exist. This was already confirmed in the prior experiment. What the present experiment revealed is that, when the temperature difference was further increased, the etching rate of the $SiO_2$ film became greater than that of the $Si_3N_4$ film again at a certain wafer temperature (within the range of 90° C. -150° C.) determined depending on the composition of the vapor supplying source. It is therefore necessary to maintain the temperature difference within a range in which the etching rate of the $Si_3N_4$ film is greater than that of the $SiO_2$ film. The range of the wafer temperature in which it is possible to selectively remove the $Si_3N_4$ film is between the temperature of the supplied vapor and the temperature determined by the composition of the vapor supplying source (from 90° C. to 150° C.). The maximum selectivity is approximately 20 ($Si_3N_4/SiO_2$).

Each diagram will be explained in detail. Referring to FIG. 6, the etching rate of the $Si_3N_4$ film exceeded that of the $SiO_2$ film in the vicinity of approximately 42° C. of the wafer temperature when hydrofluoric acid of azeotropic composition was used as the vapor supplying source. In the vicinity of 105° C. wafer temperature, the etching rate of the $SiO_2$ film again exceeded that of the $Si_3N_4$ film.

Referring to FIG. 7, the etching rate of the $Si_3N_4$ film exceeded that of the $SiO_2$ film in the vicinity of approximately 45° C. of wafer temperature when a mixture of 1:1 hydrofluoric acid to nitric acid was used as the vapor supplying source. In the vicinity of approximately 130° C. of wafer temperature, the etching rate of the $SiO_2$ film again exceeded that of the $Si_3N_4$ film.

Referring to FIG. 8, the etching rate of the $Si_3N_4$ film exceeded that of the $SiO_2$ film in the vicinity of 50° C. wafer temperature when a mixture of 2:1 hydrofluoric acid and nitric acid was used as the vapor supplying source. In the vicinity of approximately 90° C. of wafer temperature, the etching rate of the $SiO_2$ film again exceeded that of the $Si_3N_4$ film.

In the above-described experiments, hydrofluoric acid of azeotropic composition or a mixture of hydrofluoric acid and nitric acid of a predetermined ratio were used as the vapor supplying source. The inventor further carried out an experiment where hydrofluoric acid vapor and nitric acid vapor were generated separately and the silicon nitride film was removed from the silicon wafer by individually controlling the supply amounts of these vapors.

In this experiment, azeotropic composition of hydrofluoric acid and also azeotropic composition of nitric acid (69%) were prepared in separate containers. Both had their temperature adjusted to 40° C. The nitric acid was introduced into a teflon container which was dipped in a thermostatic bath to have its temperature maintained at 40° C. by the thermostatic bath. The introduction of carrier nitrogen gas into the containers of hydrofluoric acid and nitric acid caused vapors of hydrofluoric acid and nitric acid to be submitted into a chamber where a substrate was mounted to etch the silicon nitride film and the thermal silicon oxide film on the substrate.

The experiment was carried out according to two systems. In the first system, the ratio of the hydrofluoric acid vapor to the nitric acid vapor was maintained at a constant level as described above, while the temperature of the substrate was varied from 22° C. to 150° C. by changing the temperature of the hot plate. In the experiment of the second system, the hot plate temperature was fixed to 80° C. The flow rate of the nitric acid carrier gas and the flow rate of the hydrofluoric acid carrier gas were varied, and the etching rates of the silicon nitride film and the silicon oxide film and also the selectivity were verified.

Figure 9:
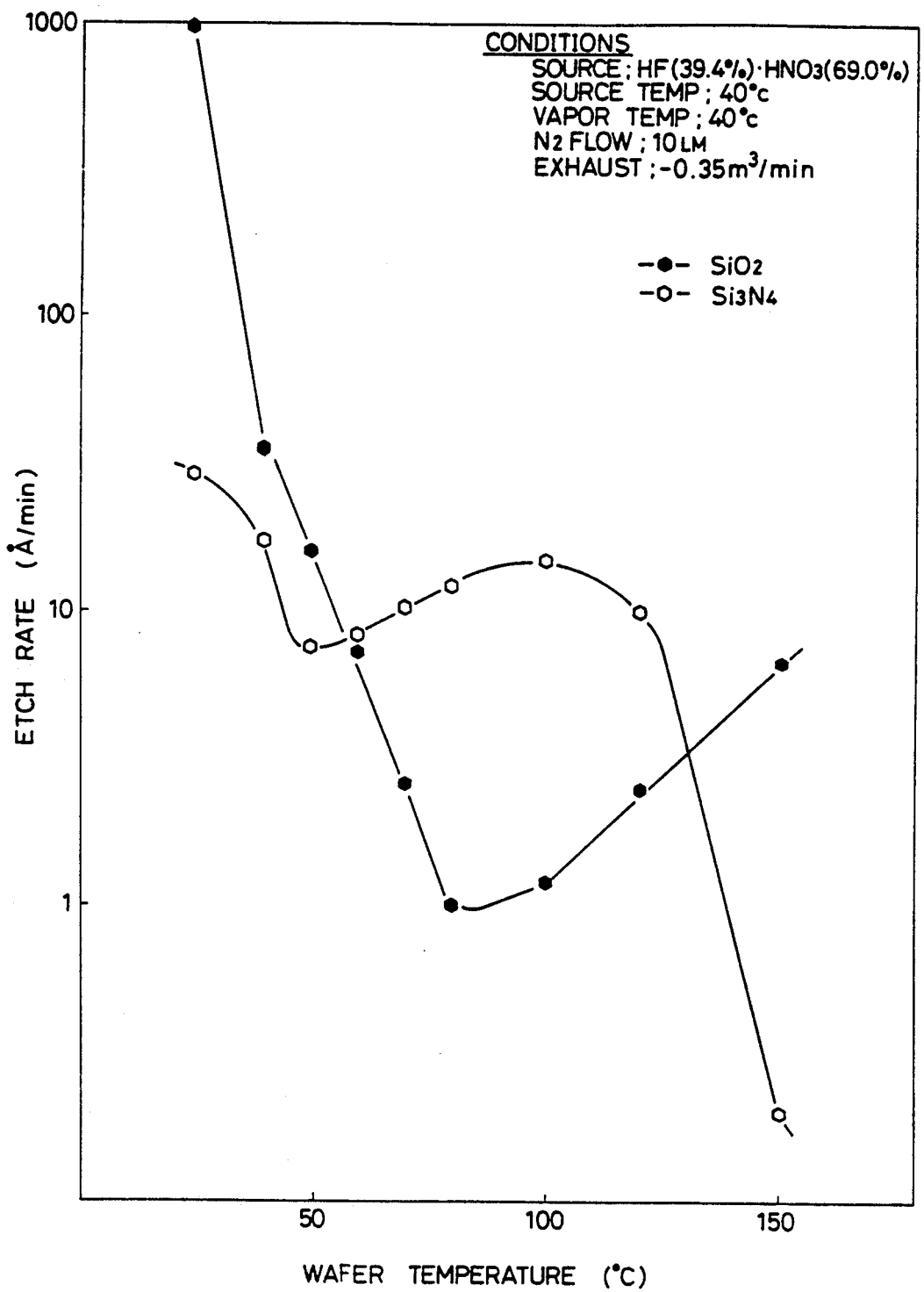
FIG. 9 is a graph showing the result obtained from various wafer temperatures when the hydrofluoric acid vapor and the nitric acid vapor are mixed at a predetermined ratio measured by the carrier gas flow rate.

The result of the first system experiment is shown in FIG. 9. Referring to FIG. 9, the etching rate of the silicon nitride film exceeded that of the $SiO_2$ film when the substrate temperature was in the vicinity of approximately 60° C. The etching rate of the $SiO_2$ film exceeded that of the $Si_3N_4$ film again when the substrate temperature was at approximately 130° C. Comparing FIG. 9 with FIGS. 7 and 8, a result similar to that obtained by the experiments of FIGS. 7 and 8 was obtained when the vapors of hydrofluoric acid and nitric acid were separately prepared and used in the etching process. However, the etching rate of the $Si_3N_4$ film was lower than those shown in FIGS. 7 and 8.

Figure 10:
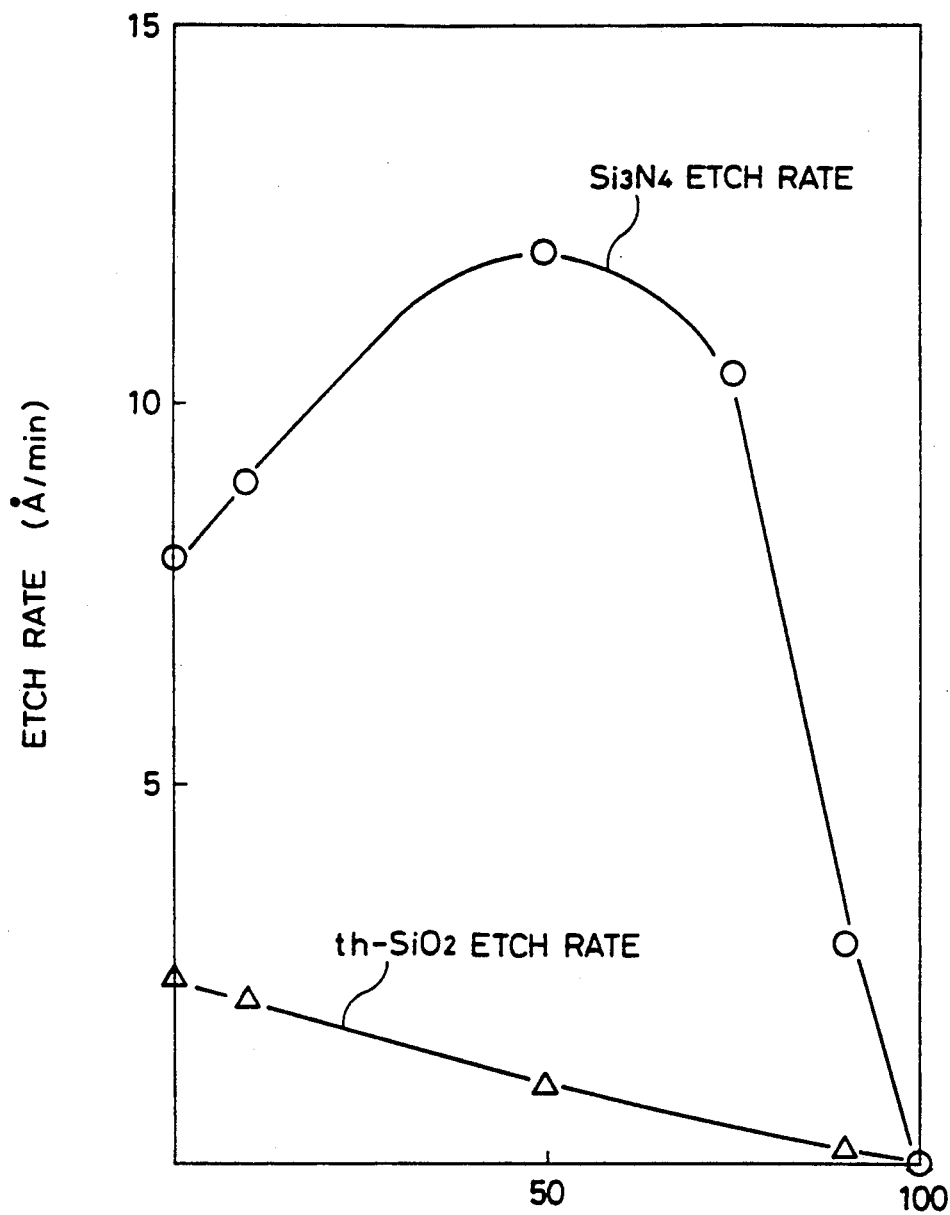
FIG. 10 is a graph showing the relationship between the occupying rate of the nitric acid vapor and the etching rates of the silicon nitride film and the thermal silicon oxide film.

FIG. 10 indicates the results obtained by the second system experiment. Referring to FIG. 10, the selectivity was maximum in the vicinity of 75% occupying rate of nitric acid vapor. The selectivity monotonously decreased when the nitric acid vapor occupying rate was lower or greater than the vicinity of 75%. It can be seen from FIG. 10 that the etching rate shows a maximum value in the vicinity of 50% of the nitric acid vapor occupying rate.

The following has become apparent from the above results. Suppose that mixed vapor is provided by a vapor source including hydrofluoric acid. Nitric acid is preferably added to the vapor. The vapor is supplied to the surface of the silicon wafer for processing the silicon nitride film and the thermal silicon oxide film. In such a case, it is possible to selectively etch the silicon nitride film by maintaining the surface temperature of the silicon wafer within a predetermined range of temperature that is higher than the temperature of the mixed vapor. The selectivity can be held at a high value by setting the temperature difference between the wafer surface and the mixed vapor to be at least 10° C., preferably more than 15° C. Although the appropriate temperature difference between the wafer surface and the mixed vapor varies depending on the composition of the vapor supplying source, the selectivity can be maintained at a high value by setting the temperature difference to at most 90° C., preferably less than 60° C.

In the above embodiments, mixed vapor is described as including hydrofluoric acid vapor (HF, $H_2O$) and vapor or gas of an oxidizing agent such as nitric acid in removing a silicon nitride film. However, the present invention is not limited to this, and mixed gas of anhydrous hydrogen fluoride (HF) gas and vapor or gas of an oxidizing agent may be used.

Although the above embodiments were described in association with selective removal of a silicon nitride film (SiNx) to a thermal oxide film (th-SiO$_2$) carried out during the LOCOS process, the applicability of the present invention is not limited to this process. Furthermore, the film to be left on the surface of the silicon layer is not limited to the thermal silicon oxide film. The oxide film may be a native oxide film or an undoped CVD oxide film (CVD, SiO$_2$), for example.

In the above embodiments, the temperature of the mixed gas was held at a constant level, and the surface temperature of the substrate was maintained within a predetermined range which is higher than the temperature of the mixed gas. However, the present invention is not limited to this, and similar results can be obtained by maintaining the temperature difference between the surface temperature of the substrate and the temperature of the mixed gas within a predetermined range. Therefore, the surface temperature of the substrate may be held at a constant level, and the temperature of the mixed gas may be maintained within a constant range that is lower than the surface temperature of the substrate.

Thus, according to the present invention, a silicon nitride film can be selectively removed from a silicon oxide film by a gaseous process. The process according to the present invention has the following advantages over the conventional wet etching method.

(1) Phosphoric acid aqueous solution of high concentration and high temperature is not used in the process of the present invention. Therefore, the process can be carried out in safety, and a circulation filtration system is not necessary. Also, means for supplying pure water into the phosphoric acid aqueous solution of high concentration is not required. Accordingly, the apparatus for carrying out the process of the present invention is relatively simple in structure.

(2) The process of the present invention eliminates the need of pumping out or circulating phosphoric acid aqueous solution of high concentration and high temperature. This increases the life time of the apparatus in comparison with the case where wetting etching method is employed. Only the temperature difference between the mixed gas and the substrate surface must be controlled to an appropriate value in the process of the present invention. Therefore, the controllability of the process of the present invention is higher than that of a conventional process.

(3) The process according to the present invention is a dry etching method. This minimizes the consumed amount of chemical agents for etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process of selectively removing a silicon nitride film from a silicon layer surface on which both a silicon oxide film and a silicon nitride film are formed, said process comprising the steps of:

preparing a gas including at least hydrogen fluoride vapor and an predetermined oxidizing agent in gas phase; and supplying said gas to said silicon layer surface while maintaining the temperature of said silicon layer surface within a range that is higher than the temperature of said gas.

2. The process according to claim 1, wherein said oxidizing agent is selected from the group consisting of nitric acid, ozone, hydrogen peroxide, hypochlorous acid, chloric acid, oxygen, sulfuric acid, chlorine, and bromine.

3. The process according to claim 1, wherein said step of supplying said gas to said silicon layer surface includes the step of directing ultraviolet light to said silicon layer surface.

4. The process according to claim 2, wherein said step of supplying said gas to said silicon layer surface includes the step of directing ultraviolet light to said silicon layer surface.

5. The process according to claim 1, wherein said step of: preparing said gas includes the steps of preparing a hydrofluoric acid solution of a predetermined composition, and producing said gas which has a predetermined temperature including hydrogen fluoride and water vapor by maintaining said hydrofluoric acid solution at a predetermined temperature.

6. The process according to claim 5, wherein said silicon oxide film includes a silicon thermal oxide film, said hydrofluoric acid solution is of an azeotropic composition, and said temperature of said silicon layer surface is maintained within a range that is approximately 2° C. to approximately 64° C. higher than the temperature of said gas.

7. The process according to claim 6, wherein said temperature of said silicon layer surface is maintained within a range that is approximately 10° C. to approximately 40° C. higher than the temperature of said gas.

8. The process according to claim 7, wherein said temperature of said silicon layer surface is maintained within a range that is approximately 20° C. to approximately 30° C. higher than the temperature of said gas.

9. The process according to claim 1, wherein said oxidizing agent includes nitric acid, and said step of preparing said gas includes the steps of:

mixing hydrofluoric acid of a predetermined concentration with nitric acid of a predetermined concentration at a predetermined volume percentage, and producing said gas by evaporating said mixture of hydrofluoric acid and nitric acid.

10. The process according to claim 9, wherein said silicon oxide film includes a silicon thermal oxide film, and said temperature of said silicon layer surface is maintained within a range that is approximately 10° C. to approximately 90° C. higher than the temperature of said gas 11. The process according to claim 10, wherein said temperature of said silicon layer surface is maintained within a range that is approximately 15° C. to approximately 60° C. higher than the temperature of said gas.

12. The process according to claim 11, wherein said temperature of said silicon layer surface is maintained within a range that is approximately 20° C. to approximately 45° C. higher than the temperature of said gas.

13. The process according to claim 1, wherein said oxidizing agent includes nitric acid, and said step of preparing said gas includes the steps of:

preparing separately hydrofluoric acid vapor of a predetermined concentration and nitric acid vapor of a predetermined concentration, and conveying said hydrofluoric acid vapor and said nitric acid vapor, respectively, by carrier gas, and mixing said hydrofluoric acid vapor and said nitric acid vapor at a predetermined carrier gas flow rate.

14. The process according to claim 13, wherein said gas comprises approximately 40% to approximately 90% nitric acid.

15. The process according to claim 14, wherein said gas comprises approximately 40% to approximately 60% nitric acid.

16. The process according to claim 14, wherein said gas comprises approximately 70% to approximately 80% nitric acid.

* * * * *